United States Patent
Micheloni et al.

(10) Patent No.: US 6,373,780 B1
(45) Date of Patent: Apr. 16, 2002

(54) SINGLE SUPPLY VOLTAGE NONVOLATILE MEMORY DEVICE WITH ROW DECODING

(75) Inventors: Rino Micheloni, Turate; Osama Khouri, Milan; Andrea Sacco, Alessandria; Massimiliano Picca, Muggio', all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/627,273

(22) Filed: Jul. 28, 2000

(30) Foreign Application Priority Data

Jul. 28, 1999 (EP) .............................. 99830483

(51) Int. Cl.⁷ ................................. G11C 8/00
(52) U.S. Cl. ................................. 365/230.06
(58) Field of Search .................. 365/230.06, 185.11, 365/185.13, 185.23, 189.11

(56) References Cited

U.S. PATENT DOCUMENTS

| | | | |
|---|---|---|---|
| 5,153,452 A | 10/1992 | Iwamura et al. | 307/296.1 |
| 5,818,764 A * | 10/1998 | Yiu et al. | 365/185.11 |
| 5,825,205 A * | 10/1998 | Ohtsuka | 326/81 |
| 5,886,923 A * | 3/1999 | Hung | 365/185.11 |
| 5,991,198 A * | 11/1999 | Song et al. | 365/185.11 |
| 6,233,198 B1 * | 5/2001 | Choi | 365/230.06 |

FOREIGN PATENT DOCUMENTS

| | | |
|---|---|---|
| DE | 19534934 A1 | 11/1996 |
| EP | 0 606650 A2 | 7/1994 |
| EP | 0 665 555 A2 | 8/1995 |

\* cited by examiner

Primary Examiner—Michael S. Lebentritt
Assistant Examiner—Anh Phung
(74) Attorney, Agent, or Firm—Lisa K. Jorgenson; E. Russell Tarleton; SEED IP Law Group PLLC

(57) ABSTRACT

The memory device comprises a memory array having an organization of the type comprising global word lines and local word lines, a global row decoder addressing the global word lines, a local row decoder addressing the local word lines, a global power supply stage supplying the global row decoder, and a local power supply stage supplying the local row decoder.

16 Claims, 2 Drawing Sheets

SINGLE SUPPLY VOLTAGE NONVOLATILE MEMORY DEVICE WITH ROW DECODING

TECHNICAL FIELD

The present invention related to a single supply voltage nonvolatile memory device with row decoding.

BACKGROUND OF THE INVENTION

As is known, memory devices are typically organized as an array, in which word lines connect gate terminals of the memory cells located on the same row, and bit lines connect drain terminals of the memory cells located on the same column.

The rows of the memory array are addressed by means of a row decoder, which receives at an input a coded address and has the purpose of biasing the word line of the row each time addressed at a stable and precise voltage, the value of which depends upon the type of operation carried out on the memory cells of that particular row (reading, programming, verifying, erasing).

In some memory devices, the memory array has an organization of the type comprising global word lines and local word lines. In particular, the memory array comprises global word lines and a plurality of local word lines for each global word line, the local word lines being connected to the corresponding global word line through respective switching stages which, when they are turned on, have the purpose of enabling transfer of the voltage present on the global word line to the respective local word line and to which the memory cells are then physically connected.

A global row decoder addresses the global word lines and a local row decoder addresses the local word lines. In particular, the global row decoder is directly connected to the global word lines and each time biases the line or lines selected, whilst the local row decoder controls the switching stages so as to enable selective connection between the local word lines and their respective global word line.

A switching stage of the type referred to above is, for example, described in the European Patent Application No. 98830570.2, filed on Sep. 30, 1998 in the name of the present applicant, and its circuit diagram is shown in FIG. 1.

In particular, the switching stage, designated as a whole by 1, is connected between a global word line 4, driven by a respective output global driving stage 5 forming part of the global row decoder (not illustrated), and a local word line 6, presents a CMOS type structure, and comprises a PMOS transistor 7 and an NMOS transistor 9 having source terminal and, respectively, drain terminal connected together to the global word line 4, drain terminal and, respectively, source terminal connected together to the local word line 6, and gate terminals receiving respective mutually complementary control signals PCH and NCH, one of which is supplied by a respective local output driving stage (not shown) forming part of the local row decoder (not shown either), whilst the other is obtained from the former via an inverter.

The NMOS transistor 9 further has a bulk terminal biased at a voltage $V_{NEG}$, which is equal to a ground voltage during the reading and programming phases of the memory cells and is equal to a negative erasing voltage, for example −8 V during the erasure phase, whilst the PMOS transistor 7 has a bulk terminal biased at a voltage $V_{PCX}$, which typically assumes a value of approximately 6 V during the reading phase and a value of approximately 1.5 V during the erasing phase, and presents a staircase waveform with a preset step during the programming phase, in which the initial value and the final value of the staircase depend upon the type of memory cells used; for example, for four level memory cells (i.e., memory cells capable of storing 2 bits per cell), the programming voltage varies between 1.5 and 9 V with a step of approximately 300 mV.

Moreover connected to the local word line 6 is a drain terminal of a discharging NMOS transistor 11 having source terminal connected to ground, bulk terminal biased at the voltage $V_{NEG}$, and gate terminal receiving a control signal DSC, and having the purpose, when it is on, of keeping the local word line 6 at the ground voltage.

In addition, during the reading and programming phases, the global word lines 4 and the local word lines 6 selected must also be biased at the voltage $V_{PCX}$, which is therefore supplied at an input, as supply voltage, both to the global row decoder and to the local row decoder in order to bias the respective internal circuitries.

It is also known, however, that memory devices are typically of the single supply voltage type; i.e., they receive from outside a single supply voltage $V_{CC}$ having a value of, for example, between 2.5 and 3.8 V.

Consequently, the voltage $V_{PCX}$ referred to above, assuming values even greater than the supply voltage $V_{CC}$, is generated inside the memory device by means of a voltage elevator circuit, generally referred to as "voltage booster" or "charge pump", supplied by the supply voltage coming from outside and supplying at an output a boosted voltage higher than the supply voltage, which, since it is not very stable in voltage, is supplied at an input of a voltage regulator, which in turn supplies at an output the voltage $V_{PCX}$ referred to above, which is stable in voltage and presents the above mentioned values.

From an electrical point of view, connected to the output of the voltage regulator is a very high parasitic capacitive load, which cannot be reduced substantially in that it is due to components that are physically required for carrying out both global and local row decoding and for biasing the bulk terminals of the PMOS transistors of the switching stages. Note, for example, that in a flash multilevel 64 bit memory, the parasitic capacitance connected to the output of the voltage regulator is of the order of 500 pF.

The presence of a high capacitive load connected to the output of the voltage regulator brings about a noticeable slowing down in the operation of the voltage regulator.

In fact, when a row of the memory array is not addressed, the corresponding word line is connected to ground, so that the capacitance associated to it is discharged; when, however, this row is addressed, the corresponding global word line is in fact connected to the output of the voltage regulator, the output voltage of which undergoes a sudden decrease caused by the well known phenomenon of charge sharing, which takes place between the overall capacitance connected to the output of the voltage regulator and the capacitance of the word line.

This situation is further aggravated by the dynamic consumption of the local output driving stages of the local row decoder, which, since they must necessarily be of reduced dimensions to be physically positioned between two adjacent local word lines, have a simple structure and require a switching current (crowbar current) that is rather high, unlike the output global driving stages of the global row decoder, which, since they are not subject to such stringent dimensional constraints, have a more complex structure and larger dimensions, and hence have a smaller dynamic consumption.

Consequently, the presence of such a high capacitive load connected to the output of the voltage regulator causes a considerable slowness in the recovery of the output voltage supplied by the voltage regulator, i.e., a considerable slowness in the restoration of the voltage supplied by it within an interval that may enable optimal reading of the memory cells; this slowness may lead, in certain cases, to a degradation of the time of access to the memory and, above all, the carrying out of wrong readings.

The presence of such a high capacitive load connected to the output of the voltage regulator has unfavourable consequences also in the programming phase of the memory cells, during which, as is known, in order to guarantee adequate accuracy in the programmed levels, a staircase voltage is applied to the word line. In particular, the high capacitive load causes the overall time for charging the word line, i.e., the time necessary for biasing the word line to each one of the levels of the staircase voltage, proves rather long.

SUMMARY OF THE INVENTION

According to principles of the present invention, a memory device comprises a memory array having an organization of the type comprising global word lines and local word lines, a global row decoder addressing the global word lines, a local row decoder addressing the local word lines, a global power supply stage supplying the global row decoder, and a local power supply stage supplying the local row decoder.

BRIEF DESCRIPTION OF THE DRAWINGS

For a better understanding of the present invention, a preferred embodiment thereof is now described to provide a non-limiting example, with reference to the attached drawings, in which.

DETAILED DESCRIPTION OF THE INVENTION

Figure 1:
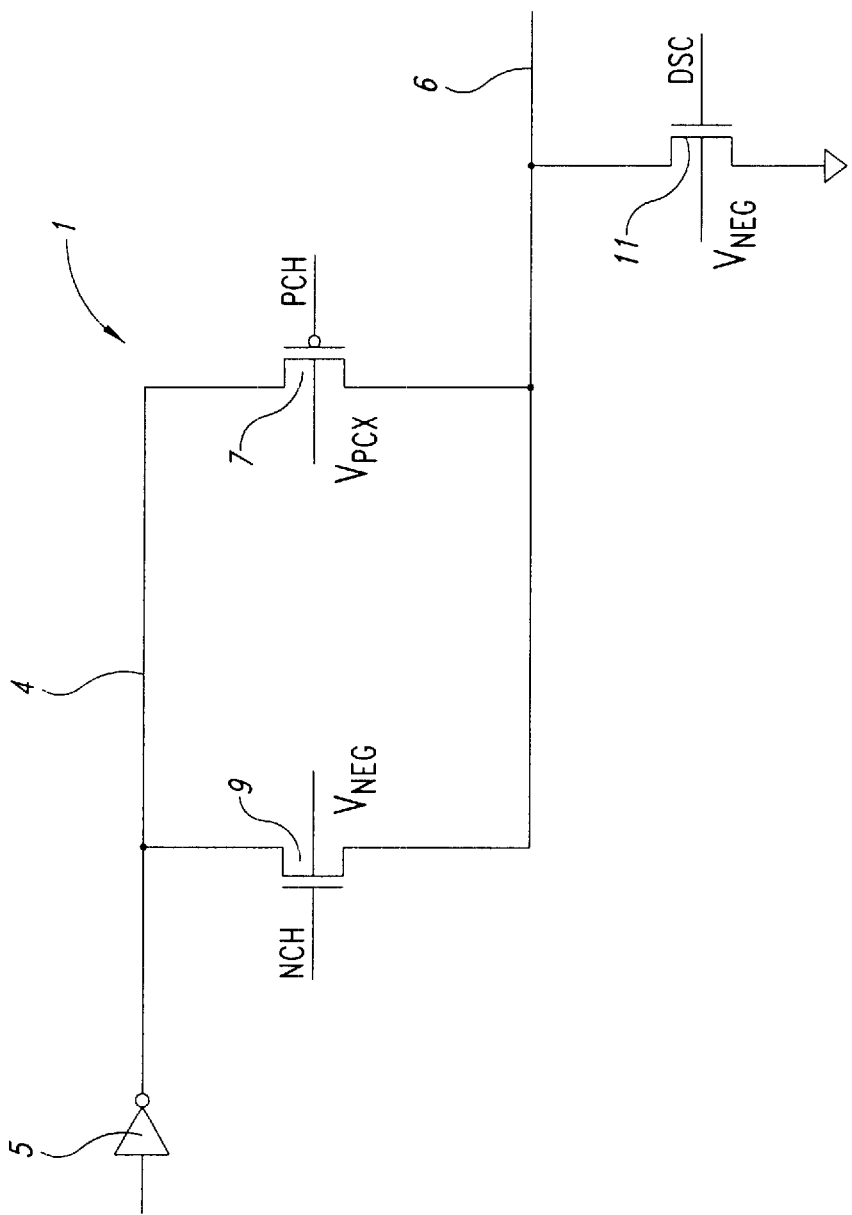
FIG. 1 shows a circuit diagram of a known switching stage.
Figure 2:
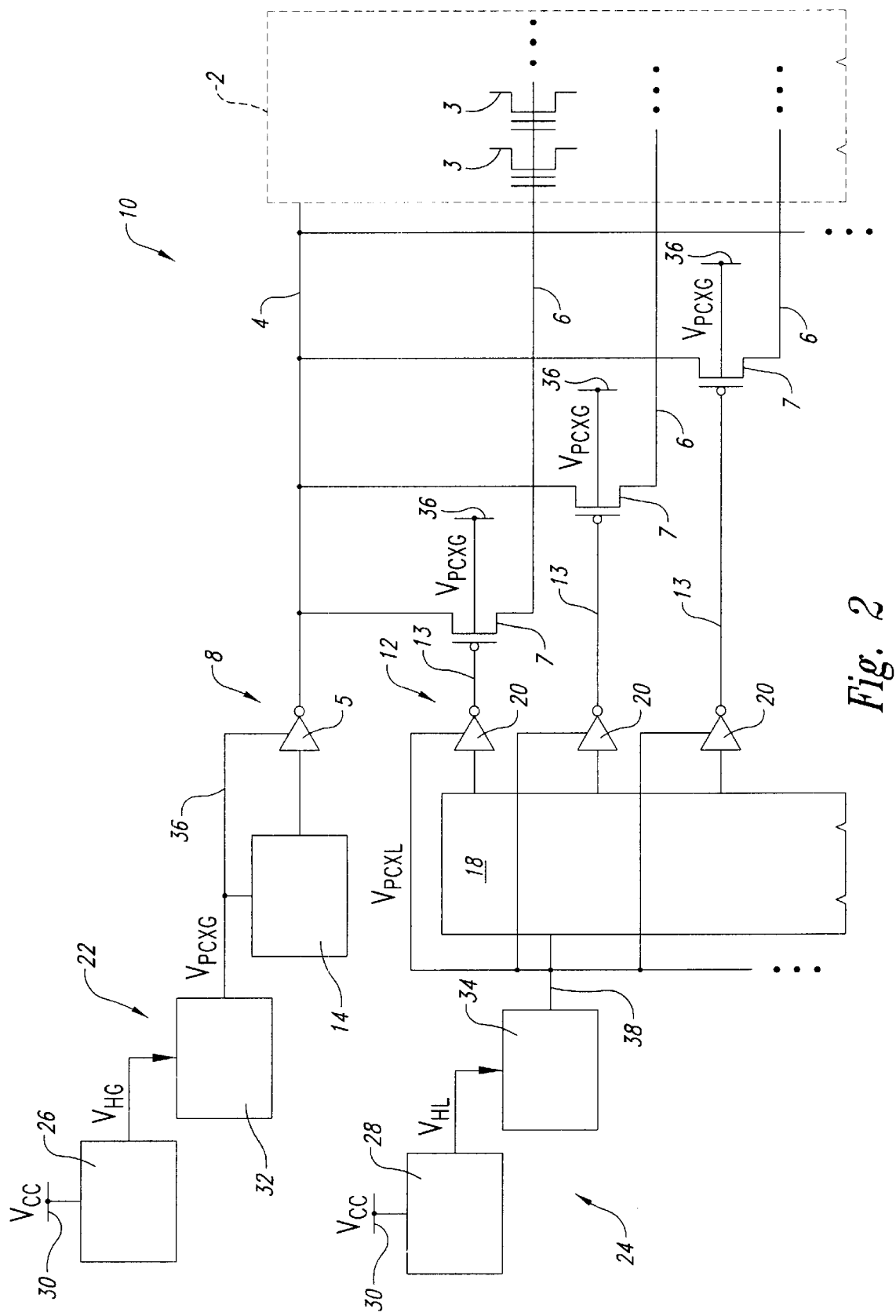
FIG. 2 shows a circuit structure of the memory array and of the corresponding global and local row decoders made according to the present invention.

In particular, for reasons of simplicity of illustration, just one of the global word lines and some of the local word lines associated to it are shown in FIG. 2, which regards solely the generation of the high positive voltages necessary for biasing the word lines during the reading and programming phases of the memory cells. Furthermore, in FIG. 2, parts that are identical to those illustrated in FIG. 1 are identified by the same reference numbers.

According to the illustration of FIG. 2, the memory device, designated as a whole by 10, comprises a memory array 2 having an organization of the type comprising global word lines 4 and local word lines 6 and including a plurality of memory cells 3, in particular multilevel memory cells, in turn organized in rows and columns, where the global word lines 4 are addressed by a global row decoder 8, and the local word lines 6 are addressed by a local row decoder 12.

In particular, associated to each global word line 4 is a plurality of local word lines 6, which are connected to the respective global word line 4 through respective selection PMOS transistors 7, each having source terminal connected to the global word line 4, drain terminal connected to the local word line 6, and gate terminal connected to the local row decoder 12 through a respective control line 13 distinct from the control lines 13 to which the other PMOS transistors 7 are connected and on which it receives a control signal.

In detail, the global row decoder 8 comprises a global decoding circuitry 14 designed to identify the global word line 4 to be addressed, and a plurality of output global driving stages 5, one for each global word line 4 (only one is shown in the Figure), which are arranged between the global decoding circuitry 14 and the global word lines 4 and are designed to bias the global word lines 4 at the voltages that are required each time.

Likewise, the local row decoder 12 comprises a local decoding circuitry 18 designed to identify the local word line 6 to be addressed, and a plurality of output local driving stages 20, one for each local word line 6, which are arranged between the local decoding circuitry 18 and the respective control lines 13 connected to the gate terminals of the PMOS transistors 7 and which are designed to control turning on and turning off of the PMOS transistors 7, so as to enable or otherwise transfer of the voltage present on the global word line 4 to the local word lines 6.

Addressing of the global word lines 4 may be alternatively performed by means of a single global row decoder 8 or by means of a number of global row decoders 8 distinct from one another, just as addressing of the local word lines 6 may be alternatively performed by a single local row decoder 12 or by a number of local row decoders 12 distinct from one another.

In addition, according to the present invention, the memory device 10 comprises a global supply stage 22 supplying solely the global row decoder 8, and a local supply stage 24 distinct from the global supply stage 22 and supplying solely the local row decoder 12.

In particular, the global supply stage 22 comprises a global charge pump 26 having an input connected to a supply line 30 set at the supply voltage $V_{CC}$ (supplied from outside to the memory device 10) and an output on which it supplies a global boosted voltage $V_{HG}$ having an amplitude greater than that of the supply voltage $V_{CC}$ (for example, 10 V) and a global voltage regulator 32 having an input connected to the output of the global charge pump 26 and an output connected to a global supply line 36 and on which it supplies a global voltage $V_{PCXG}$, which is stable in voltage and assumes a value $V_R$ (reading voltage) of approximately 6 V during the reading phase, and instead presents a staircase waveform with a fixed step of approximately 300 mV during the programming phase, in which the initial and final values of the step depend upon the type of memory cells used; for example, for four level memory cells (i.e., memory cells capable of storing 2 bits per cell), the programming voltage varies between 1.5 and 9 V with a step of approximately 300 mV.

Connected to the global supply line 36 are both the global decoding circuitry 14 and the output global driving stages 5, from which they receive the global voltage $V_{PCXG}$. Also connected to the global supply line 36 are all the bulk terminals of the PMOS transistors 7, so that they are biased at the highest voltage in order to prevent both temporary direct biasing of the PN junctions (latch up phenomenon) and the so-called "body effect".

The local supply stage 24 presents a structure altogether identical to that of the global supply stage 22 and comprises a local charge pump 28 having an input connected to the supply line 30 and an output on which it supplies a local boosted voltage $V_{HL}$ having an amplitude greater than that of the supply voltage $V_{CC}$, and a global voltage regulator 32 having an input connected to the output of the local charge pump 26 and an output which is connected to a local supply line 38 and on which it supplies a local voltage $V_{PCXL}$, which is stable in voltage and assumes a value a little higher than $V_R$ during the reading phase, and two distinct values during the programming phase, namely, a value smaller than $V_R$ if the amplitude of the programming pulse is lower than that of $V_R$, and approximately 9 V if the amplitude of the programming pulse is greater than that of $V_R$.

Connected to the local supply line 38 are both the local decoding circuitry 18 and the output local driving stages 20; from the local supply line 38 the local decoding circuitry 18 and the output local driving stages 20 receive the local voltage $V_{PCXL}$.

Operation of the memory device 10 is as follows. When the memory device turns on, the capacitances associated to the gate terminals of the PMOS transistors 7 are all pre-charged to bring the gate terminals of the PMOS transistors 7 to the local voltage $V_{PCXL}$.

Consequently, when a local word line 6 is addressed, the global word line 4 to which the local word line 6 is connected is biased by the corresponding output global driving stage 5 at the global voltage $V_{PCXG}$, whilst the gate terminal of the PMOS transistor 7 to which the local word line 6 is connected is brought, by the output local driving stage 20, to the ground voltage, discharging the capacitances associated to it.

In this way, the PMOS transistor 7 connected to the local word line 6 addressed, is turned on and guarantees complete transfer of the voltage present on the global word line 4 to the local word line 6 that is addressed, whilst the PMOS transistors 7 connected to the local word lines 6 which are not addressed are turned off, and these local word lines 6 are kept at the ground voltage through respective discharging NMOS transistors of the type illustrated in FIG. 1.

In this way, addressing of a local word line 6 is particularly fast, in that, to bring to the ground voltage the gate terminal of the PMOS transistor 7 to which the word line is connected, it is sufficient to discharge the small parasitic capacitance associated to this gate terminal.

Consequently, according to the present invention, the global supply stage 22 is destined to the biasing of the global row decoder 8 and of the global word lines 4 and local word lines 6 in the reading and programming phases, whereas the local supply stage 24 is destined only to the biasing of the local row decoder 12 and to the supply of the current necessary for causing the output local driving stages 20 to switch.

As a result, the separation of the supplying of circuitry dedicated to global decoding from the supplying of the circuitry dedicated to local decoding enables splitting of the capacitive load, which, in the known art, is connected to the output of the voltage regulator, into two distinct capacitive loads, each connected to the output of a respective voltage regulator 32, 34, so enabling a considerable reduction, during the reading phase, in the time for recovery of the said voltage regulators, and, during the programming phase, the time for charging the global word line addressed.

Finally, it is clear that modifications and variations may be made to the memory device described and illustrated herein, without thereby departing from the sphere of protection of the present invention.

For example, an NMOS transistor could be connected in parallel to each PMOS transistor 7, so as to create a CMOS switching stage of the type illustrated in FIG. 1.

What is claimed is:

1. A memory device comprising:
   a hierarchical memory array;
   global word lines and local word lines associated with the hierarchical memory array;
   a global decoding circuit addressing said global word lines;
   a local decoding circuit addressing said local word lines;
   selectors controlled by the local decoding circuit and configured to connect each global word line to a corresponding local word line;
   a global power supply circuit supplying said global decoding circuit, said global word lines, said selectors, and said local word lines; and
   a local power supply circuit supplying said local decoding circuit.

2. The memory device according to claim 1, wherein said global power supply circuit and said local power supply circuit are distinct from one another.

3. The memory device according to claim 1, wherein said global power supply circuit and said local power supply circuit each comprise voltage elevating circuits having an input connected to a supply line set at a first reference potential and supplying on an output a respective second reference potential, and a voltage regulating circuit having an input connected to the output of the respective voltage elevating circuit and supplying on an output a respective third reference potential.

4. The memory device according to claim 1, further comprising a plurality of said local word lines for each of said global word lines, and a plurality of selection circuits each arranged between a local word line and a respective global word line; said selection circuit being connected to said local row decoding circuit through respective control lines that are distinct from one another.

5. The memory device according to claim 4, wherein each of said plurality of selection circuits comprises at least one selection transistor having a control terminal connected to said local row decoding circuit through a respective said control line.

6. A nonvolatile memory device having a voltage supply circuit for a single supply voltage, the device comprising:
   a memory array having at least one global word line and at least one local word line;
   at least one global decoding circuit coupled to the at least one global word line and at least one local decoding circuit coupled to the at least one local word line;
   at least one output global driving stage coupled to the at least one global word line and at least one output local driving stage coupled to the at least one local word line;
   a global supply stage coupled to the single supply voltage and having an output coupled to the at least one global decoding circuit and to the at least one output global driving stage, the global supply stage configured to receive the single supply voltage and to output a global boosted voltage having an amplitude greater that that of the single supply voltage; and
   a local supply stage coupled to the single supply voltage and having an output coupled to the at least one output local driving stage and to the at least one local driving stage, the local supply stage configured to receive the single supply voltage and to output a local boosted voltage that is greater than the supply voltage.

7. The device of claim 6, wherein the global supply stage comprises a global charge pump configured to output a boosted global supply voltage and a global voltage regulator configured to receive the boosted global supply voltage and to output the global boosted voltage that is stable in voltage.

8. The device of claim 7, wherein the global boosted voltage assumes a global reading voltage value of approximately 6 volts during a reading phase of the memory device and during a programming phase outputs a staircase waveform.

9. The device of claim 8, wherein the staircase waveform of the global boosted voltage has a voltage that varies between 1.5 Volts and 9 Volts with a step of approximately 300 mV.

10. The device of claim 6, wherein the local supply stage comprises a local charge pump configured to output a boosted local supply voltage and a local voltage regulator configured to receive the boosted local supply voltage and to output the local boosted voltage that is stable in voltage.

11. The device of claim 10, wherein the local boosted voltage assumes a local reading voltage value during a reading phase and two distinct values during a programming phase.

12. The device of claim 10, wherein the local boosted voltage assumes a local reading voltage value higher than the global reading voltage value during a reading stage and a first local programming voltage value of less than the global reading voltage value when a programming pulse is less than the global reading voltage value and a second local programming voltage value of approximately 9 Volts when the programming pulse has an amplitude greater than the global reading voltage value.

13. A voltage supply circuit for a single supply voltage nonvolatile memory device having a memory array with global word lines and local word lines, and associated global row decoder with global row driving stages and local row decoders with local row driving stages, respectively, the voltage supply circuit comprising:

a global voltage supply stage having an input coupled to the single supply voltage and an output coupled to the global row decoder and the global row driving stages; and a local voltage supply stage having an input coupled to the single supply voltage and an output coupled to the local row decoder and local row driving stages;

the global voltage supply stage configured to bias the global row decoder and the global row driving stages during reading and programming phases, and the local voltage supply stage is configured to bias only the local row decoder and to supply the current necessary to cause the local row driving stages to switch.

14. A memory device comprising:

a memory array;

global word lines and local word lines;

a global row line decoding circuit addressing the global word lines;

a local row word decoding circuit addressing the local word lines;

a global power supply circuit supplying the global row decoding circuit; and a local power supply circuit supplying the local row decoding circuit, the global power supply circuit and the local power circuit each comprising voltage elevating circuits having an input connected to a supply line set at a first reference potential and supplying on an output a respective second reference potential, and a voltage regulating circuit having an input connected to the output of the respective voltage elevating circuit and supplying on an output a respective third reference potential.

15. A memory device comprising:

a memory array;

global word lines and local word lines;

global row line decoding circuit addressing the global word lines;

local row word decoding circuit addressing the local word lines; and a plurality of local word lines for each of the global word lines, and a plurality of selection circuits each arranged between a local word line and a respective global word line; the selection circuit connected to the local row decoding circuit through respective control lines that are distinct from one another.

16. A memory device comprising:

a memory array;

global word lines and local word lines;

global row line decoding circuit addressing the global word lines;

local row word decoding circuit addressing the local word lines; and a plurality of local word lines for each of the global word lines, and a plurality of selection circuits each arranged between a local word line and a respective global word line; the selection circuit connected to the local row decoding circuit through respective control lines that are distinct from one another, each of the selection circuits comprise at least one selection transistor having a control terminal connected to the local row decoding circuit through a respective control line.

\* \* \* \* \*